(12) United States Patent
Ebiike et al.

(10) Patent No.: US 10,276,711 B2
(45) Date of Patent: Apr. 30, 2019

(54) SEMICONDUCTOR DEVICE AND METHOD OF MANUFACTURING THE SAME

(71) Applicant: Mitsubishi Electric Corporation, Tokyo (JP)

(72) Inventors: Yuji Ebiike, Tokyo (JP); Naoki Yutani, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/841,724

(22) Filed: Dec. 14, 2017

(65) Prior Publication Data

US 2018/0308973 A1    Oct. 25, 2018

(30) Foreign Application Priority Data

Apr. 21, 2017    (JP) .................................. 2017-084243

(51) Int. Cl.
| *H01L 29/78* | (2006.01) |
| *H01L 29/739* | (2006.01) |
| *H01L 21/66* | (2006.01) |
| *H01L 29/06* | (2006.01) |
| *H01L 29/16* | (2006.01) |
| *H01L 29/66* | (2006.01) |

(52) U.S. Cl.
CPC .......... *H01L 29/7823* (2013.01); *H01L 22/12* (2013.01); *H01L 29/0696* (2013.01); *H01L 29/1608* (2013.01); *H01L 29/66068* (2013.01); *H01L 29/7393* (2013.01); *H01L 29/7395* (2013.01); *H01L 29/7806* (2013.01); *H01L 29/7811* (2013.01); *H01L 29/7818* (2013.01)

(58) Field of Classification Search
CPC ............. H01L 29/0696; H01L 29/1095; H01L 29/66325; H01L 29/7302; H01L 29/7393; H01L 29/7395; H01L 29/7811; H01L 29/7818; H01L 29/7823
See application file for complete search history.

(56) References Cited

U.S. PATENT DOCUMENTS

| 2010/0025693 | A1* | 2/2010 | Malhan | ................. | H01L 29/063 |
|  |  |  |  |  | 257/76 |
| 2015/0144965 | A1* | 5/2015 | Tsuji | ...................... | H01L 29/47 |
|  |  |  |  |  | 257/77 |
| 2015/0255544 | A1* | 9/2015 | Uchida | ............... | H01L 29/1608 |
|  |  |  |  |  | 257/77 |
| 2016/0003889 | A1 | 1/2016 | Watanabe et al. |  |  |

FOREIGN PATENT DOCUMENTS

WO       2014/148294 A1       9/2014

* cited by examiner

*Primary Examiner* — Eduardo A Rodela
(74) *Attorney, Agent, or Firm* — Studebaker & Brackett PC

(57) ABSTRACT

Provided is a semiconductor device including an active region provided in a first conductivity type semiconductor layer and a termination region provided around the active region. A MOS transistor through which a main current flows in a thickness direction of the semiconductor layer is formed in the active region. The termination region includes a defect detection device provided along the active region. The defect detection device includes a diode including a first main electrode provided along the active region on a first main surface of the semiconductor layer, and a second main electrode provided on a second main surface side of the semiconductor layer.

10 Claims, 14 Drawing Sheets

F I G. 1
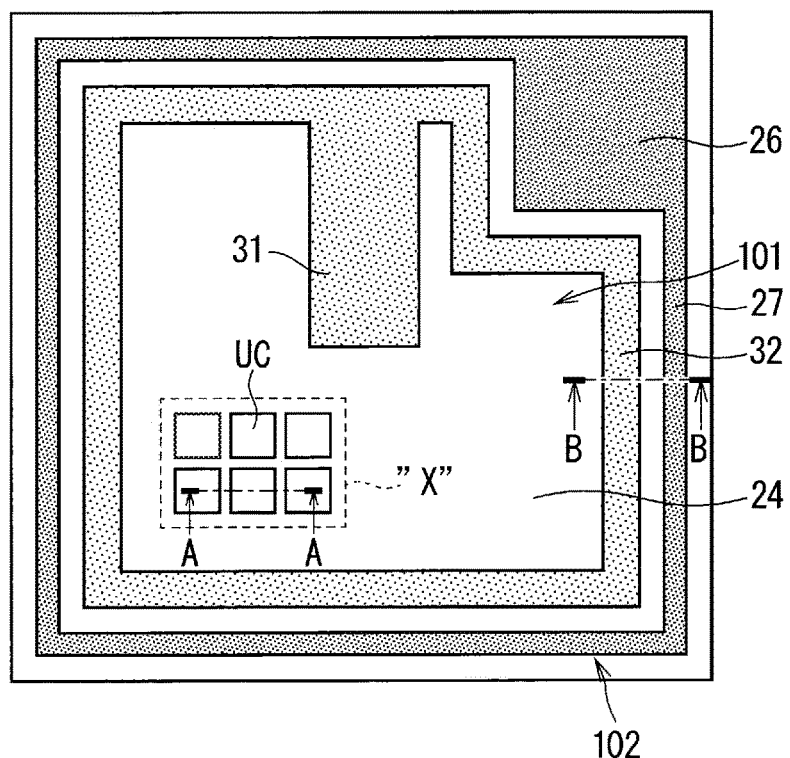

SEMICONDUCTOR DEVICE AND METHOD OF MANUFACTURING THE SAME

BACKGROUND OF THE INVENTION

Field of the Invention

The present invention relates to a semiconductor device, and in particular relates to a wide-bandgap semiconductor device using a wide-bandgap semiconductor.

Description of the Background Art

For power saving of a power electronics device such as an inverter, it is necessary to reduce a power loss of a switching device, such as an insulated gate bipolar transistor (IGBT) and a metal oxide semiconductor field effect transistor (MOSFET).

Since a power loss depends on a conduction loss and a switching loss of a switching device, in order to reduce these losses, wide-bandgap semiconductor devices using a wide-bandgap semiconductor such as silicon carbide (SiC) and gallium nitride (GaN) have been developed.

When a power MOSFET is used as a switching device, a return current (freewheel current) can be passed through a parasitic diode of the power MOSFET (hereinafter referred to as a body diode). It is known that using a body diode enables downsizing or omission of a freewheel diode placed in parallel to the power MOSFET. This has been applied to power converter circuits.

An SiC semiconductor device has a problem in that a bipolar operation using p-type and n-type carriers leads to expansion of a crystal defect due to carrier recombination energy and increase in resistance. This problem also occurs when passing the freewheel current through the body diode. Increase in a power loss and occurrence of a malfunction caused by increase in on-state resistance of a power MOSFET have posed a problem.

WO 2014/148294 discloses a method of passing a large current through a SiC-MOSFET to apply current stress and expanding a crystal defect for screening. A screening method according to this prior art employs a method of expanding a crystal defect of a body diode to saturation and then determining the degree of change in a forward resistance by setting a temperature of a bipolar device in a chip state at 150 to 230° C. and continuously passing a forward current of a current density of 120 to 400 A/cm² through the bipolar device.

In a SiC-MOSFET, improving reliability of a body diode is important for securing stability of device operation and assuring reliability in a market. As described in WO 2014/148294, applying electric power to a body diode in a chip state, expanding a crystal defect, and then measuring and evaluating a forward characteristic make it possible to secure reliability of the body diode and secure stability of the device operation.

However, it is difficult, by the screening method of WO 2014/148294, to fully expand a crystal defect in a termination region provided outside an active region of a SiC-MOSFET by applying current stress. A possible cause thereof is that recombination energy is unlikely to reach the crystal defect in the termination region provided outside the active region and assumed stress is not applied to the crystal defect, and that a crystal defect resulting from such a macroscopic defect as a carrot-like defect does not expand to saturation.

In the latter case, when the macroscopic defect is present within the active region of the SiC-MOSFET, determination can be made by withstand voltage characteristic evaluation of a test process. However, when the macroscopic defect is present outside the active region and recombination energy necessary for defect expansion does not reach the defect by applying current stress to the body diode, while the body diode is used as a freewheel diode, it cannot be evaluated whether the crystal defect outside the active region expands and affects the body diode, indicating that the screening method of WO 2014/148294 cannot fully secure reliability of the body diode.

SUMMARY

An object of the present invention is to provide a semiconductor device capable of securing reliability of the body diode and securing stability of device operation.

A semiconductor device according to the present invention includes an active region provided in a first conductivity type semiconductor layer and a termination region provided around the active region. A MOS transistor through which a main current flows in a thickness direction of the semiconductor layer is formed in the active region. The termination region includes a defect detection device provided along the active region. The defect detection device includes a diode including: a first main electrode provided along the active region on a first main surface of the semiconductor layer; and a second main electrode provided on a second main surface side of the semiconductor layer.

The semiconductor device according to the present invention provides a semiconductor device that can secure reliability of the body diode of the MOS transistor and secure stability of device operation.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a plan view illustrating an upper surface configuration of a semiconductor device of a first preferred embodiment according to the present invention;

DESCRIPTION OF THE PREFERRED EMBODIMENTS

<Introduction>

Figure 2:
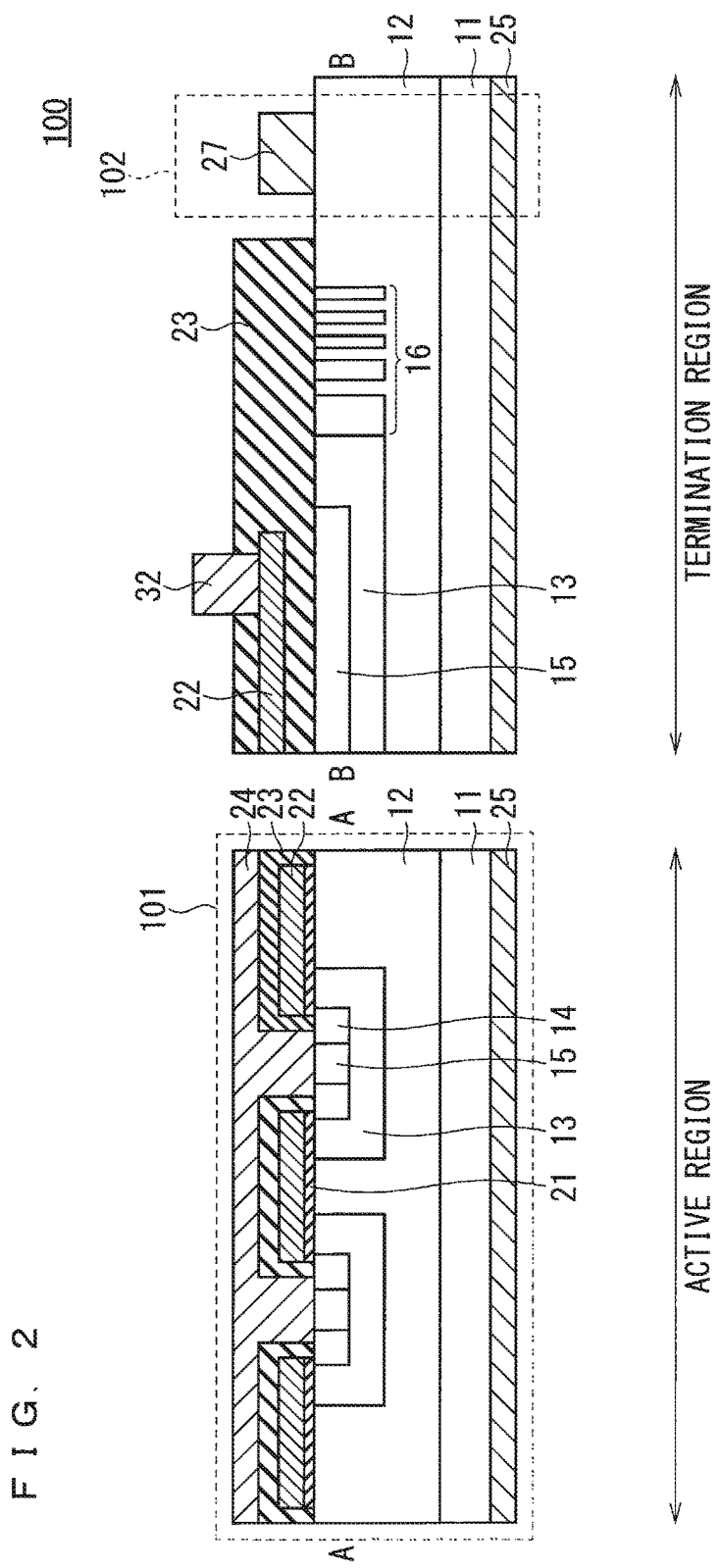
FIG. 2 is a cross-sectional view illustrating a cross-sectional configuration of the semiconductor device of the first preferred embodiment according to the present invention.

A term "MOS" has conventionally been used for a junction structure of metal/oxide/semiconductor and is said to be abbreviated to initials of metal-oxide-semiconductor. However, in particular, in a field-effect transistor that a a MOS structure (hereinafter simply referred to as "MOS transistor"), materials of a gate insulation film and a gate electrode have been improved from viewpoints of integration and improvement in manufacturing processes in recent years.

For example, in a MOS transistor, mainly from a viewpoint of forming self-aligned source and drain, polycrystalline silicon has been employed instead of metal as a material of a gate electrode. Also, from a viewpoint of improving electric characteristics, a high-dielectric constant material is employed as a material of a gate insulation film, but the material is not necessarily limited to an oxide.

Therefore, the term "MOS" is not necessarily employed under limitation to a laminated structure of metal/oxide/semiconductor, and this specification does not also assume such limitation. That is, in view of technical common sense, "MOS" mentioned here has a meaning not only as an abbreviation resulting from the origin of the term but also widely including a laminated structure of conductor/insulator/semiconductor.

Regarding conductivity types of impurities, the following descriptions generally define n type as "first conductivity type" and p type as "second conductivity type", but the conductivity types may be reversely defined.

<First Preferred Embodiment>
<Configuration of Device>

FIG. 1 is a plan view illustrating an upper surface configuration of a semiconductor device 100 of a first preferred embodiment of a semiconductor device according to the present invention. Note that the semiconductor device 100 has a configuration in which a defect detection device 102 is attached to a silicon carbide MOS transistor (SiC-MOSFET) 101.

As illustrated in FIG. 1, the semiconductor device 100 has a configuration in which the SiC-MOSFET 101 is provided in a center of the semiconductor device 100 having a rectangular external shape, and the defect detection device 102 is provided along an outer perimeter of the SiC-MOSFET 101, A source electrode 24 of the SiC-MOSFET 101 is provided in a central portion of the semiconductor device 100. A plan-view shape of the source electrode 24 has a shape with a central portion of one side of the rectangle recessed inward. A gate pad 31 is provided so as to go into the inward recessed portion of the source electrode 24. One corner among four corners of the source electrode 24, in the example of FIG. 1, one corner on a side on which the gate pad 31 is provided is cut in an L shape and forms a notch portion. A gate wire 32 extending from the gate pad 31 is provided along an external shape of the source electrode 24, and the source electrode 24 is surrounded with the gate wire 32.

A region "X" of FIG. 1 illustrates unit cells UC provided in a lower portion of the source electrode 24 by omitting part of the source electrode 24 for convenience. The gate pad 31 is a section to which a gate voltage is applied from an external control circuit (not illustrated). The gate voltage applied to the gate pad 31 is supplied to a gate electrode (not illustrated) of the unit cell UC, which is a minimum unit structure of the SiC-MOSFET 101, through the gate wire 32.

The source electrode 24 is provided on an active region where the plurality of unit cells UC is placed. The source electrode 24 has a configuration in which a source region (not illustrated) of each unit cell UC is electrically connected in parallel. Therefore, it can be said that the plan-view shape of the source electrode 24 is identical to the plan-view shape of the active region.

In the present invention, "the active region" is a region through which a main current flows in an on state of the semiconductor device. "A termination region" is a region around the active region. "The termination region" includes regions in which the gate pad 31 and the gate wire 32 are placed. "An impurity concentration" represents a peak value of an impurity concentration in each region. Furthermore, in the following description, "an outer perimeter side" refers to a direction that goes out of the semiconductor device 100 in a plan-view direction of the semiconductor device 100 (planar direction) illustrated in FIG. 1. "An inner perimeter side" refers to an opposite direction of "the outer perimeter side."

On a further outer perimeter side of the gate wire 32, an anode electrode 27 (first main electrode) of the defect detection device 102 is provided spaced apart from the gate wire 32. The anode electrode 27 extends from an electrode pad 26 having a quadrangular plan-view shape provided in one corner of the semiconductor device 100. The anode electrode 27 is provided along the gate wire 32. Note that the electrode pad 26 is provided so as to go into the notch portion of the source electrode 24.

Note that the plan-view shape of the source electrode 24, placement and plan-view shape of the gate pad 31, and placement and plan-view shape of the electrode pad 26 are not limited to the above placement and plan-view shape.

FIG. 2 illustrates a cross-sectional configuration of the active region illustrated by the line A-A in FIG. 1, and a cross-sectional configuration of the termination region illustrated by the line B-B.

As illustrated in the active region of FIG. 2, the SiC-MOSFET 101 includes an SiC epitaxial layer 12 (semiconductor layer) provided on a main surface of an SiC substrate 11 including n-type impurities, a plurality of p-type well regions 13 selectively provided in an upper layer of the epitaxial layer 12, and an n-type (first conductivity type) source region 14 and a p-type (second conductivity type) well contact region 15 provided in an upper layer of each of the well regions 13.

The well contact region 15 is provided in order to stabilize a switching characteristic by causing the source region 14 and the well region 13 to have the same potential. The well contact region 15 is provided so as to be sandwiched between the source regions 14 from a cross-sectional view.

In the termination region of FIG. 2, a withstand voltage holding region 16 is provided for securing a withstand voltage in an upper layer of the epitaxial layer 12 on the outer perimeter side of the well region 13. The withstand voltage holding region 16 includes a plurality of p-type impurity regions. The withstand voltage holding region 16 is provided so as to extend at intervals toward an end of the epitaxial layer 12 in a planar direction on the outer perimeter side of the well region 13. Note that placement intervals, placement width, and impurity concentration of the plurality of p-type impurity regions are set based on a product rating such as a withstand voltage of the SiC-MOSFET 101.

As illustrated in the active region of FIG. 2, a gate insulation film 21 is provided so as to cover a region from between the adjacent well regions 13 to a peripheral portion of the well region 13 and a peripheral portion of the source region 14 on a first main surface of the epitaxial layer 12. A gate electrode 22 is provided on the gate insulation film 21.

The gate insulation film 21 and the gate electrode 22 are covered with an interlayer insulation film 23. The source electrode 24 is provided so as to be in contact with an upper portion of the source region 14 and the well contact region 15 that are not covered with the interlayer insulation film 23. Note that the interlayer insulation film 23 is also provided in the termination region and covers the gate electrode 22 extending to the termination region. The gate electrode 22 is connected to the gate wire 32 provided so as to reach the gate electrode 22 through the interlayer insulation film 23 in the termination region.

In order to cause the source region 14 and the well contact region 15 to make an ohmic contact with the source electrode 24, although illustration is omitted, for example, a nickel silicide film is provided on the source region 14 and the well contact region 15 that are not covered with the interlayer insulation film 23.

A drain electrode 25 is provided on a second main surface side of the epitaxial layer 12, more specifically, on a main surface (back surface) on an opposite side of the SiC substrate 11 on which the epitaxial layer 12 is provided. The drain electrode 25 is also provided in the termination region. In the defect detection device 102 provided in the outermost perimeter of the termination region, the drain electrode 25 functions as a cathode electrode (second main electrode).

The defect detection device 102 is a Schottky barrier diode that is provided on the epitaxial layer 12, has the anode electrode 27 that makes a Schottky contact with the epitaxial layer 12, and uses the drain electrode 25 as a cathode electrode.

Thus, it becomes easy to detect a crystal defect in the termination region through the electrode pad 26 by connecting the anode electrode 27 to the electrode pad 26.

<Operation>

First, an operation of the SiC-MOSFET 101 in the semiconductor device 100 will be described. In the SiC-MOSFET 101, when a positive voltage equal to or greater than a threshold is applied to the gate electrode 22, a channel that serves as a path for a main current will be formed in a surface layer of the well region 13. When a positive voltage is applied to the drain electrode 25 in this state, the main current will flow from the drain electrode 25 to the source electrode 24 through the epitaxial layer 12, the surface layer of the well region 13 (channel), and the source region 14.

Meanwhile, when the positive voltage applied to the gate electrode 22 becomes less than the threshold or a negative voltage is applied to the gate electrode 22, the channel will disappear. This prevents a current from flowing between the drain and the source even if a high voltage is applied to the drain electrode 25. Also, since the withstand voltage holding region 16 is provided, electric field concentration to the termination region can be relieved.

Figure 3:
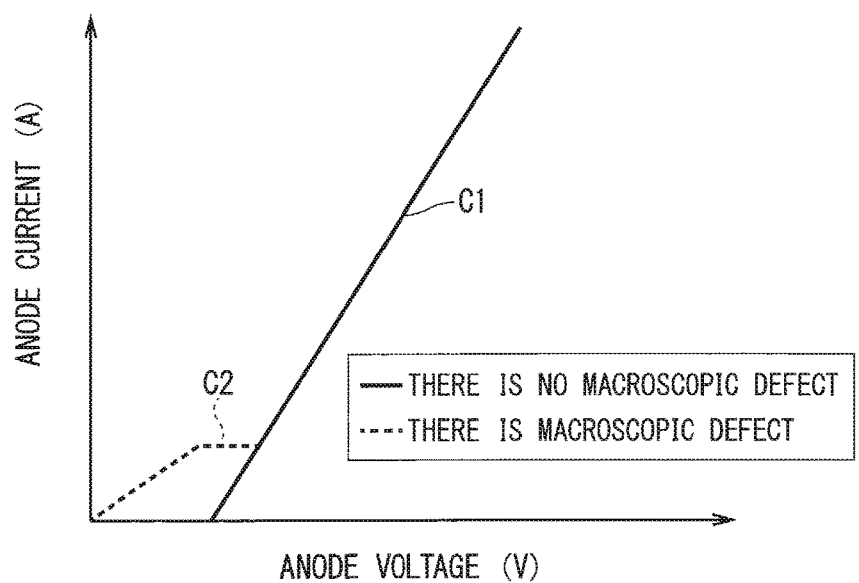
FIG. 3 is a diagram illustrating a rising waveform of a diode.

Next, a screening method performed by the defect detection device 102 will be described. When a positive voltage (forward voltage) is applied to the anode electrode 27 and is increased, if there is no macroscopic defect near the anode electrode 27, a rising waveform of a diode resulting from the Schottky barrier is obtained. Meanwhile, if there is such a relatively large defect as a carrot-like defect near the anode electrode 27, the Schottky barrier is not formed appropriately in this portion, and thus the rising waveform of a diode is not obtained. FIG. 3 is a diagram illustrating a rising waveform of a diode, and a horizontal axis represents an anode voltage (V) whereas a vertical axis represents an anode current (A). A solid line represents a characteristic C1 when there is no macroscopic defect, whereas a dashed line represents a characteristic C2 when there is a macroscopic defect. FIG. 3 illustrates a forward characteristic of a diode in which, when there is no macroscopic defect, the anode current does not flow until the anode voltage reaches a turn-on voltage, and when the anode voltage reaches the turn-on voltage, the anode current will start to flow rapidly. When there is a macroscopic defect, the anode current flows before the anode voltage reaches the turn-on voltage, which indicates that the diode does not function as a diode.

Thus, when the rising waveform of a diode is obtained, it is determined that there is no such a relatively large defect as a carrot-like defect in the termination region. Meanwhile, when the rising waveform of a diode is not obtained, it is determined that there is such a relatively large defect as a carrot-like defect in the termination region. When there is such a defect as a carrot-like defect in the termination region, evaluation will be made that, while a body diode is used as a freewheel diode, the crystal defect may expand and affect the body diode. A semiconductor device that has been evaluated in this way cannot secure reliability of the body diode, and thus will be excluded from products.

Note that when a Schottky barrier diode is used as the defect detection device 102, a forward direction operation is a unipolar operation. Therefore, the rising waveform has a resistance component as illustrated in FIG. 3, which is characterized in that characteristic fluctuation can be easily grasped when the defect expands.

Figure 4:
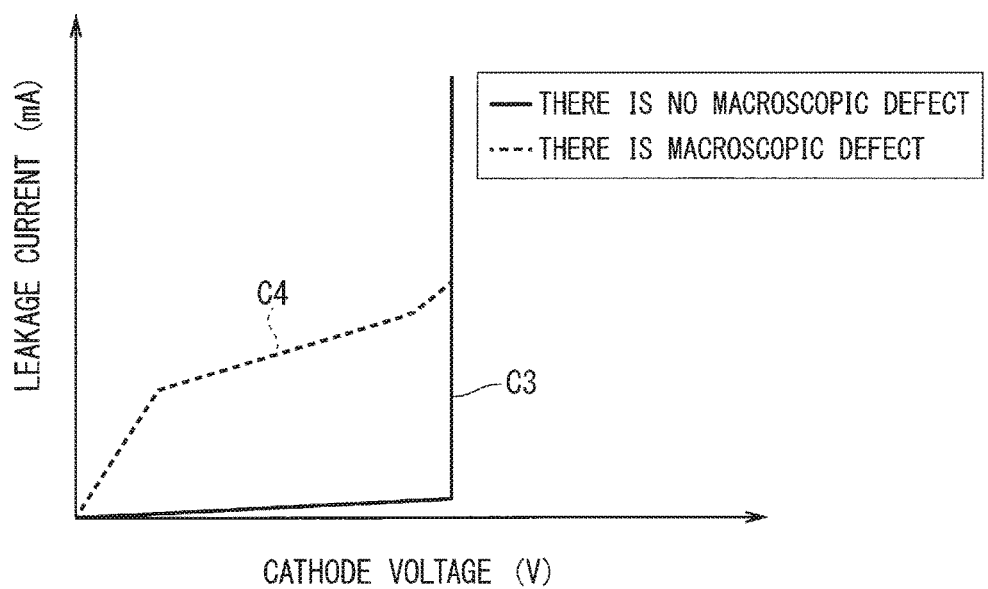
FIG. 4 is a diagram illustrating a withstand voltage waveform of a diode.

Next, when a negative voltage is applied to the anode electrode 27 or a positive voltage is applied to the cathode electrode 25 and a reverse voltage increases, if there is no macroscopic defect near the anode electrode 27, a withstand voltage waveform (leakage current waveform) of a diode resulting from the Schottky barrier is obtained. On the other hand, when there is a relatively large defect as a carrot-like defect near the anode electrode 27, the withstand voltage waveform of a diode will not be obtained. FIG. 4 is a diagram illustrating a withstand voltage waveform of a diode, and a horizontal axis represents a cathode voltage (V) whereas a vertical axis represents a leakage current (mA). A solid line represents a characteristic C3 when there is no macroscopic defect, whereas a dashed line represents a characteristic C4 when there is a macroscopic defect. FIG. 4 illustrates a reverse characteristic of a diode in which, when there is no macroscopic defect, only a slight leakage current flows until the cathode voltage reaches a breakdown voltage, and when the cathode voltage reaches the breakdown voltage, the leakage current will start flowing rapidly. When there is a macroscopic defect, a large leakage current flows before the cathode voltage reaches the breakdown voltage, which indicates that the diode does not have a withstand voltage.

Thus, when the withstand voltage waveform of a diode is obtained, it is determined that there is no such a relatively large defect as a carrot-like defect in the termination region. On the other hand, when the withstand voltage waveform of a diode is not obtained, it is determined that there is not such a relatively large defect as a carrot-like defect in the termination region. When there is such a defect as a carrot-like defect in the termination region, evaluation will be made that, while a body diode is used as a freewheel diode, the crystal defect may expand and affect the body diode. A semiconductor device that has received such evaluation cannot secure reliability of the body diode, and thus will be excluded from products.

By using at least one of the forward characteristic and reverse characteristic of a diode detected by the defect detection device 102 as described above, it is possible to detect a crystal defect in the termination region that cannot be detected by a current stress test to the body diode in the active region of the SiC-MOSFET 101. This makes it possible to determine the semiconductor device 100 that may be unable to secure stability of a device operation when a crystal defect expands in the termination region, resulting from stress to the body diode, such as passing a freewheel current through the body diode in the active region of the SiC-MOSFET 101.

Not only a bipolar operation when the freewheel current flows through the body diode in the active region, but also a bipolar operation when the freewheel current flows through the well contact region 15 in the termination region contributes to expansion of a crystal defect in the termination region.

Note that the screening may be performed on the semiconductor device 100 in a wafer state, and may be performed on the semiconductor device 100 in a chip state after being cut into individual chips in a dicing process.

The defect detection device 102 placed to surround the SiC-MOSFET 101 produces the following effects. That is, when detecting the forward characteristic of a diode, since a Schottky barrier needs to be present in a portion for detecting a crystal defect, the defect detection device 102 placed to surround the SiC-MOSFET 101 can inhibit omission of detection of a crystal defect and perform effective determination.

When the reverse characteristic (withstand voltage characteristic) of a diode is detected, by expanding a depletion layer to a defect region by a negative bias, a defect in the withstand voltage characteristic will be detected. When the defect detection device 102 is placed to surround the SiC-MOSFET 101, even if a relatively low voltage is applied and the depletion layer is not large, omission of detection of a crystal defect can be inhibited, and effective determination can be made.

Also, placing the defect detection device 102 to surround the SiC-MOSFET 101 enables inhibition of decrease in an effective area of the semiconductor device 100 and efficiently producing effects by providing the defect detection device 102.

Note that the defect detection device 102 does not need to completely surround the SiC-MOSFET 101. For example, the defect detection device 102 may have a configuration in which the anode electrode 27 is broken halfway.

It is desirable that the defect detection device 102 be sufficiently distant from the withstand voltage holding region 16 so as to prevent interference with the depletion layer that occurs from the withstand voltage holding region 16 in order to prevent influence when a high voltage is applied to the drain electrode 25 of the SiC-MOSFET 101. A thickness of the epitaxial layer 12 may be designed to the same extent as a region where the depletion layer expands.

A distance from the outermost perimeter of the withstand voltage holding region 16 to the defect detection device 102 is preferably designed to the same extent as the thickness of the epitaxial layer 12.

<Manufacturing Method>

Next, a manufacturing method of the semiconductor device 100 of the first preferred embodiment will be described with reference to FIGS. 5 to 9, which are cross-sectional views sequentially illustrating manufacturing processes. Note that the following manufacturing method is one example. In particular, procedures may be changed as long as the change does not cause problems.

Figure 5:
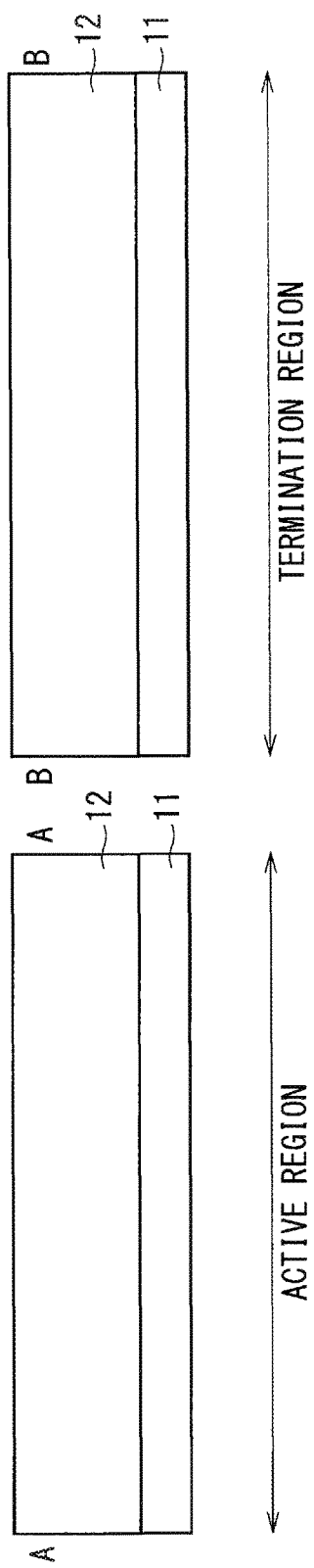
FIGS. 5 to 9 are cross-sectional views each illustrating a manufacturing process of the semiconductor device of the first preferred embodiment according to the present invention.

First, in the process illustrated in FIG. 5, the SiC substrate 11 is prepared and the n-type epitaxial layer 12 is formed on the SiC substrate 11 by the known epitaxial growth method. This SiC substrate 11 is in a wafer state before dicing. As the SiC substrate 11, a substrate that has specific resistance of 0.015 to 0.028 Ωcm and contains n-type impurities is used, but the SiC substrate 11 is not limited to this substrate. For example, a semi-insulating substrate having specific resistance of several MΩcm may be used. Using the semi-insulating substrate can reduce parasitic resistance.

SiC is a wide-bandgap semiconductor with a bandgap wider than a bandgap of Si. A switching device and a diode including a wide-bandgap semiconductor as a substrate material have a high withstand voltage and high allowable current density, thereby enabling downsizing compared with a silicon semiconductor device. Using these downsized switching device and diode enables downsizing of a semiconductor device module incorporating these devices.

Also, high heat resistance enables downsizing of a radiation fin of a heat sink, air cooling instead of water cooling, and further downsizing of the semiconductor device module.

A concentration of n-type impurities of the epitaxial layer 12 is, for example, $1 \times 10^{13}$ cm$^{-3}$ to $1 \times 10^{18}$ cm$^{-3}$, and a thickness is 4 µm to 200 µm. However, the concentration and thickness are not limited to these figures and can be set as appropriate according to a rating of the semiconductor device 100.

Next, a resist mask in which a portion corresponding to the well region 13 is an opening is formed on the epitaxial layer 12 by using the known photolithographic technique. P-type impurity ions, such as aluminum (Al), are then implanted through the resist mask, thereby forming the well region 13 illustrated in FIG. 6. A depth of the well region 13 is 0.3 µm to 2.0 µm, and an impurity concentration is $1 \times 10^{15}$ cm$^{-3}$ to $1 \times 10^{18}$ cm$^{-3}$.

Similarly, a resist mask in which a portion corresponding to the source region 14 is an opening is formed on the epitaxial layer 12 by using the known photolithographic technique. N-type impurity ions, such as nitrogen (N), are then implanted through the resist mask, thereby forming the source region 14 illustrated in FIG. 6. A depth of the source region 14 is set to prohibit a bottom surface of the source region 14 from exceeding a bottom surface of the well region 13. An impurity concentration is set to, for example, $1 \times 10^{17}$ cm$^{-3}$ to $1 \times 10^{21}$ cm$^{-3}$ so as to exceed the impurity concentration of the well region 13.

Also, a resist mask in which a portion corresponding to the well contact region 15 is an opening is formed on the epitaxial layer 12 by using the known photolithographic technique. P-type impurity ions, such as Al, are then implanted through the resist mask, thereby forming the well contact region 15 illustrated in FIG. 6. An impurity concentration of the well contact region 15 is set to $1 \times 10^{17}$ cm$^{-3}$ to $1 \times 10^{21}$ cm$^{-3}$, and a depth is set to 0.3 µm to 1.0 µm to allow electric connection between the well contact region 15 and the well region 13. Note that it is desirable that ions be implanted at a substrate temperature of 150° C. or more when the well contact region 15 is formed.

Figure 6:
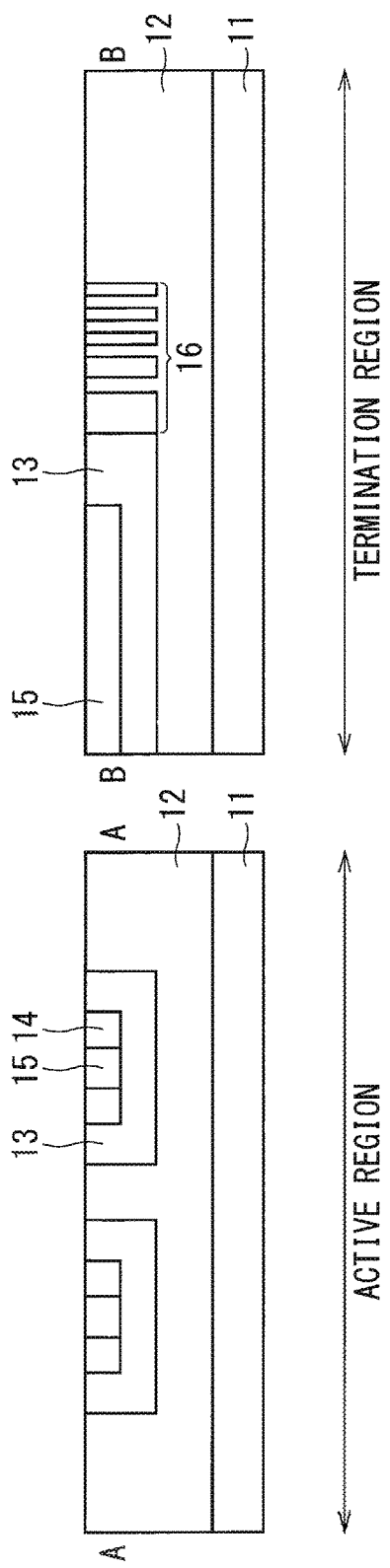

Also, a resist mask in which a portion corresponding to the withstand voltage holding region 16 is an opening is formed on the epitaxial layer 12 by using the known photolithographic technique. P-type impurity ions, such as Al, are then implanted through the resist mask, thereby forming the withstand voltage holding region 16 illustrated in FIG. 6. An impurity concentration of the withstand voltage holding region 16 is set to $1 \times 10^{13}$ cm$^{-3}$ to $1 \times 10^{18}$ cm$^{-3}$, and a depth is set to 0.3 μm to 2.0 μm. The withstand voltage holding region 16 includes a plurality of p-type impurity regions as illustrated in FIG. 6, and a width and interval of each impurity region may be changed step by step in order to inhibit electric field concentration. Also, the impurity concentration may be reduced step by step toward an outer perimeter side of the semiconductor device 100. Note that when the impurity concentration is set to be identical between the well region 13 and the withstand voltage holding region 16, both regions may be formed in an identical process.

In the above description, a resist mask is used in order to selectively form an impurity region, but a silicon oxide film may be used as a mask. When the silicon oxide mask is formed, first, a silicon oxide film is formed on the epitaxial layer 12. Then, after a photolithographic process and an etching process, an opening for impurity implantation is formed in the silicon oxide film to make a mask.

The SiC substrate 11 in a wafer state after the impurity region is formed is mounted on a heat treatment apparatus, and annealing is performed in an inert gas atmosphere, such as Ar gas. The annealing is performed, for example, for 30 seconds to 1 hour at temperatures of from 1300° C. to 1900° C. This annealing activates ion-implanted n-type impurities such as N and p-type impurities such as Al.

Figure 7:
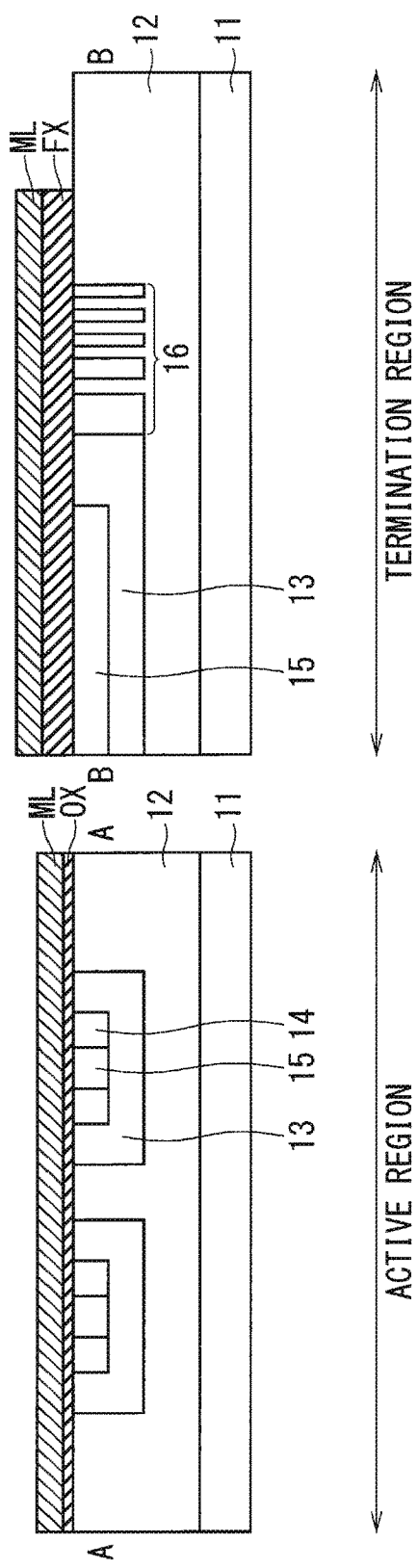

Next, in the process illustrated in FIG. 7, a silicon oxide film OX is formed on the epitaxial layer 12. The silicon oxide film OX is formed, for example, using a deposition method such as a thermal oxidation method or a chemical vapor deposition (CVD) method. Subsequently, heat treatment is performed in an atmosphere such as nitrogen, ammonia, NO, and $N_2O$. Note that the silicon oxide film OX is formed so as to have a thickness sufficient for functioning as a gate insulation film. In the termination region, a field insulation film thicker than the gate insulation film is formed before the silicon oxide film OX is formed. The field insulation film becomes thicker in the process of forming the silicon oxide film OX, and becomes a field insulation film FX. Note that the field insulation film FX is not formed in a region in which the defect detection device of the termination region is to be formed.

Next, as illustrated in FIG. 7, for example, a polysilicon film ML is formed by the CVD method on the silicon oxide film OX and the field insulation film FX. The polysilicon film ML may contain impurities such as phosphorus (P) and boron (B). Containing impurities can implement low sheet resistance. Note that the polysilicon film ML is not formed in a region in which the defect detection device of the termination region is to be formed.

Figure 8:
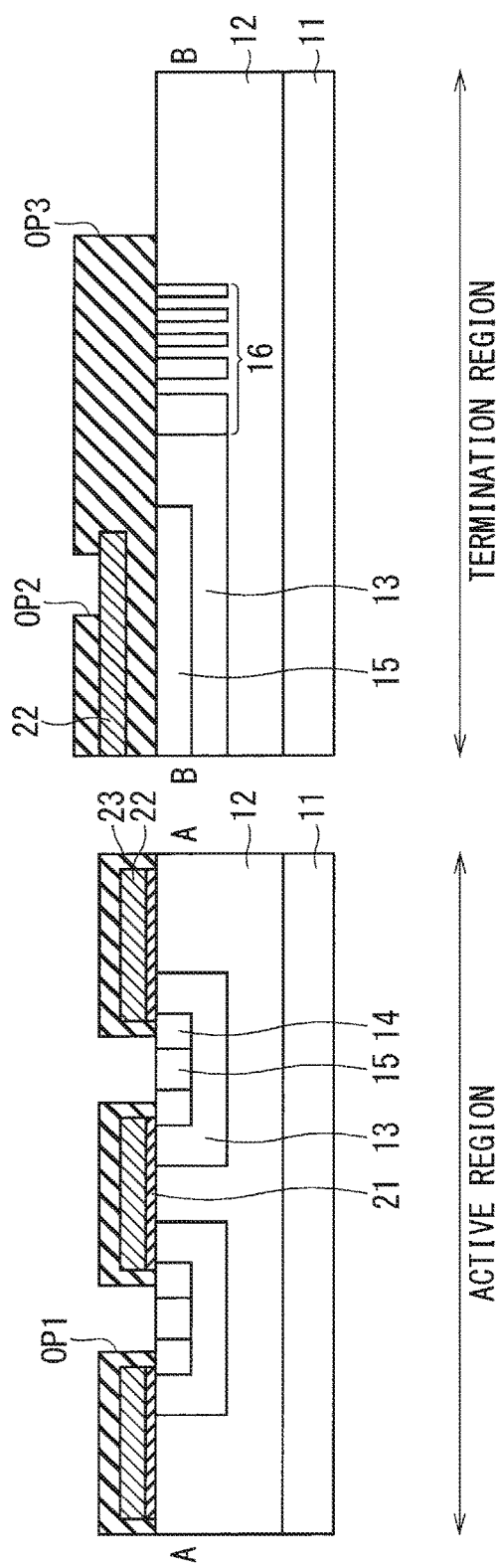

Next, in the process illustrated in FIG. 8, a resist mask that covers a portion corresponding to the gate electrode 22 is formed on the polysilicon film ML by using the known photolithographic technique. The gate electrode 22 is then formed by selectively eliminating the polysilicon film ML by etching by using the resist mask as an etching mask.

Subsequently, the gate insulation film 21 is formed by selectively eliminating the silicon oxide film OX by etching by using the gate electrode 22 and the resist mask thereon as an etching mask. Note that the thickness of the field insulation film FX corresponds to the thickness of the silicon oxide film OX is eliminated in the termination region. However, the silicon oxide film OX is thinner than the field insulation film FX, which is compensated in the following process of forming the interlayer insulation film.

Next, a silicon oxide film is formed, for example, by the CVD method to cover the gate insulation film 21 and the gate electrode 22, which becomes the interlayer insulation film 23. Note that although the interlayer insulation film 23 is formed on the field insulation film FX in the termination region, both films are integrated and thus are referred to as the interlayer insulation film 23.

Subsequently, as illustrated in FIG. 8, the resist mask is used as an etching mask, and an opening OP1 is formed in which at least part of the source region 14 and the well contact region 15 is exposed to a bottom surface in the active region. In the termination region, an opening OP2 is formed in which the gate electrode 22 is exposed to a bottom surface, and an opening OP3 is formed in which the epitaxial layer 12 is exposed to a bottom surface in a region in which the defect detection device is to be formed.

Subsequently, in order to make an ohmic contact between the source region 14 and the well contact region 15 exposed by etching and the source electrode 24, for example, a nickel (Ni) film is formed by the sputtering method or evaporation method on the entire interlayer insulation film 23. Heat treatment is then performed at 600° C. to 1000° C. to form nickel silicide. An unreacted Ni film on the interlayer insulation film 23 is eliminated by wet etching. Nickel silicide is also formed on the bottom surface of the opening OP3 in the region in which the defect detection device is to be formed, and a Schottky barrier diode is formed because nickel silicide makes a Schottky contact with the epitaxial layer 12. The region in which the defect detection device is to be formed is covered with the field insulation film FX and the interlayer insulation film 23 at the time of this process to prevent exposure, thereby preventing nickel silicide from being formed. Then, Schottky contact with the conductive film can be formed by exposing the region in which the defect detection device is to be formed before the next process of forming the conductive film. Note that illustration of nickel silicide is omitted for simplification.

Next, a conductive film is formed on the interlayer insulation film 23 by the sputtering method or evaporation method, and the conductive film fills the openings OP1, OP2, and OP3. The conductive film may be a metal film, such as aluminum (Al), copper (Cu), titanium (Ti), nickel (Ni), molybdenum (Mo), tungsten (W), and tantalum (Ta). The conductive film may be a nitride film of such a metal, or an alloy film obtained by adding one or more types of another element to such a metal as a main component. Here, the element of the main component refers to an element with a highest content among elements that constitute an alloy. Note that the conductive film on the interlayer insulation film 23 may not be a single-layer film but may be a lamination film including two or more layers of the above metal film, nitride film, and alloy film.

Figure 9:
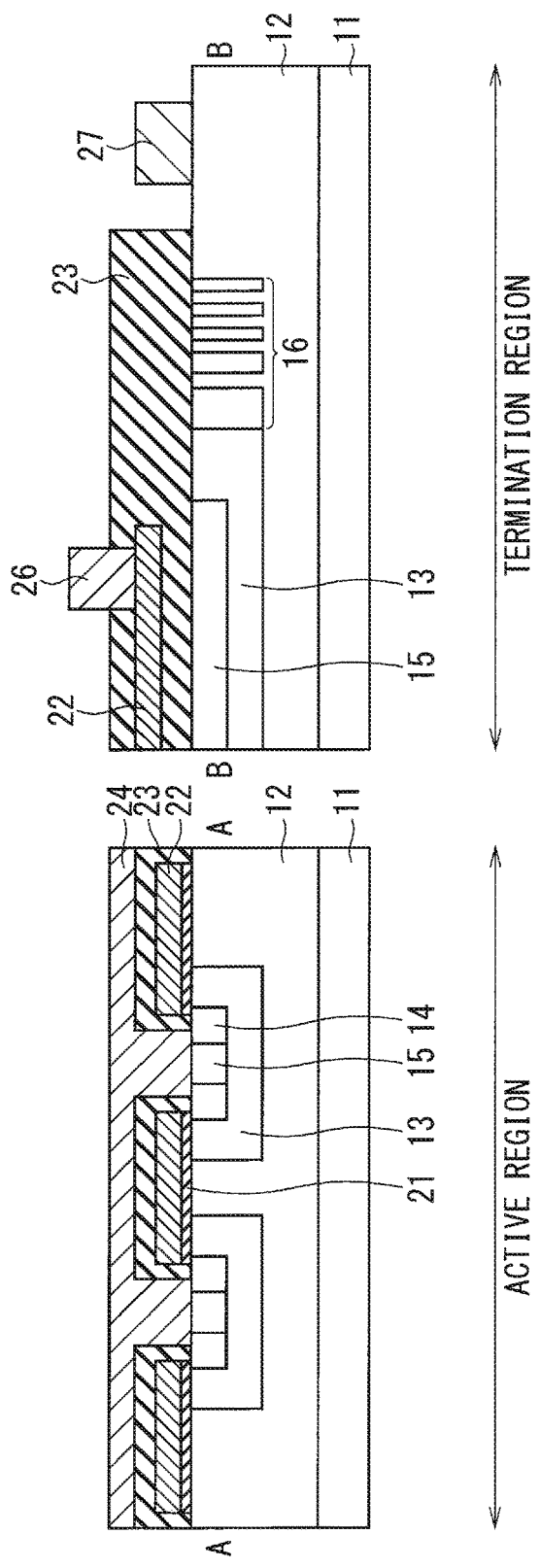

Then, by patterning the conductive film on the interlayer insulation film 23 by etching, as illustrated in FIG. 9, the gate wire 32 connected to the gate electrode 22, the source electrode 24, and the anode electrode 27 are formed. Note that the anode electrode 27 may be formed in a process different from the process for the gate wire 32 and the source electrode 24.

By finally forming the drain electrode 25 on the back of the SiC substrate 11. the semiconductor device 100 illustrated in FIG. 2 is completed. The drain electrode 25 can be obtained by forming a metal film, such as titanium (Ti), nickel (Ni), silver (Ag), and gold (Au), by the sputtering method or evaporation method.

<Variation 1>

In the plan view of the semiconductor device 100 illustrated in FIG. 1, the source electrode 24 has a square outline shape in a similar manner to the semiconductor device 100 having a rectangular external shape. The gate wire 32, which is provided along the external shape of the source electrode 24, also has a square outline shape in a similar manner to the source electrode 24.

Figure 10:
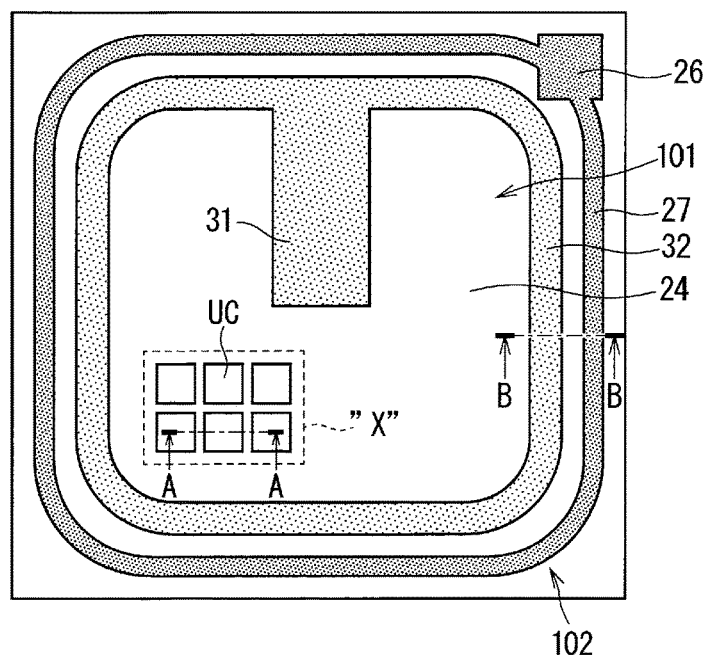
FIG. 10 is a plan view illustrating an upper surface configuration of variation 1 of the semiconductor device of the first preferred embodiment according to the present invention.

FIG. 10 is a plan view illustrating an upper surface configuration of a semiconductor device 100A according to variation 1 of the first preferred embodiment. Note that in FIG. 10, the same configuration as in the semiconductor device 100 described with reference to FIG. 1 is denoted with the same reference symbol, and the duplicate descriptions thereof will be omitted.

As illustrated in FIG. 10, in the semiconductor device 100A, four corners of a source electrode 24 are curvature portions having a curvature for the purpose of inhibiting electric field concentration. A gate wire 32, which is provided along an external shape of the source electrode 24, also has curvature portions in a similar manner to the source electrode 24. Also in an anode electrode 27, four corners are curvature portions, and an electrode pad 26 is placed in space between the curvature portions obtained by eliminating the corners.

Therefore, as compared with the semiconductor device 100 of the first preferred embodiment in which one corner of four corners of the source electrode 24 is a notch portion and the electrode pad 26 is placed in space of this notch portion, effects similar to effects of the first preferred embodiment can be produced, without reducing an effective area of a SiC-MOSFET, and improvement in a withstand voltage can be achieved.

The gate wire 32, which is provided along an external shape of the source electrode 24, also has curvature portions in a similar manner to the source electrode 24. This inhibits electric field concentration in the corners.

Note that although the electrode pad 26 has a quadrangular shape in FIG. 10, of course this portion may be a configuration without any corners, such as circular and elliptical shapes. This also applies to the semiconductor device 100 illustrated in FIG. 1.

<Variation 2>

Figure 11:
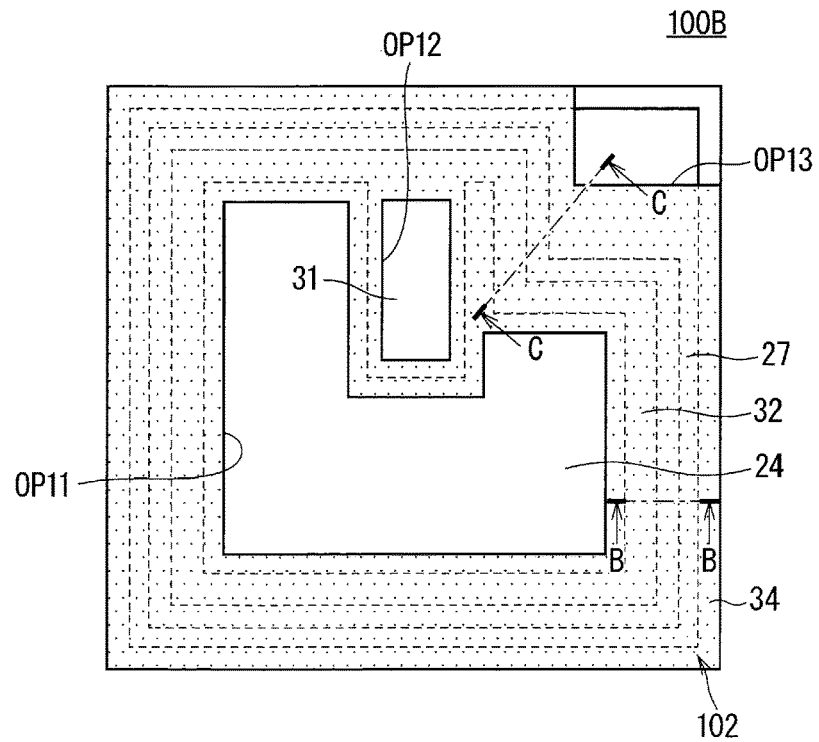
FIG. 11 is a plan view illustrating an upper surface configuration of variation 2 of the semiconductor device of the first preferred embodiment according to the present invention.
Figure 12:
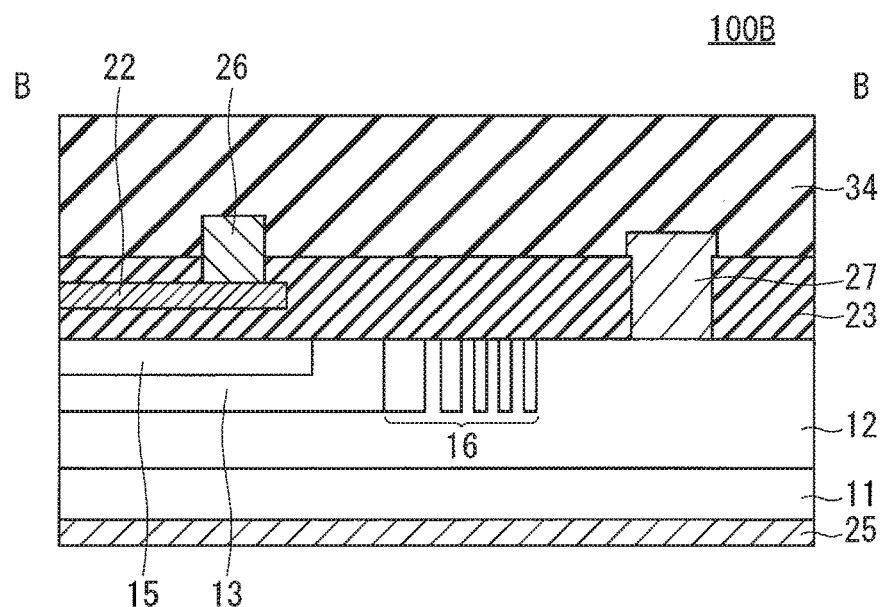
FIGS. 12 to 13 are cross-sectional views each illustrating a cross-sectional configuration of variation 2 of the semiconductor device of the first preferred embodiment according to the present invention.
Figure 13:
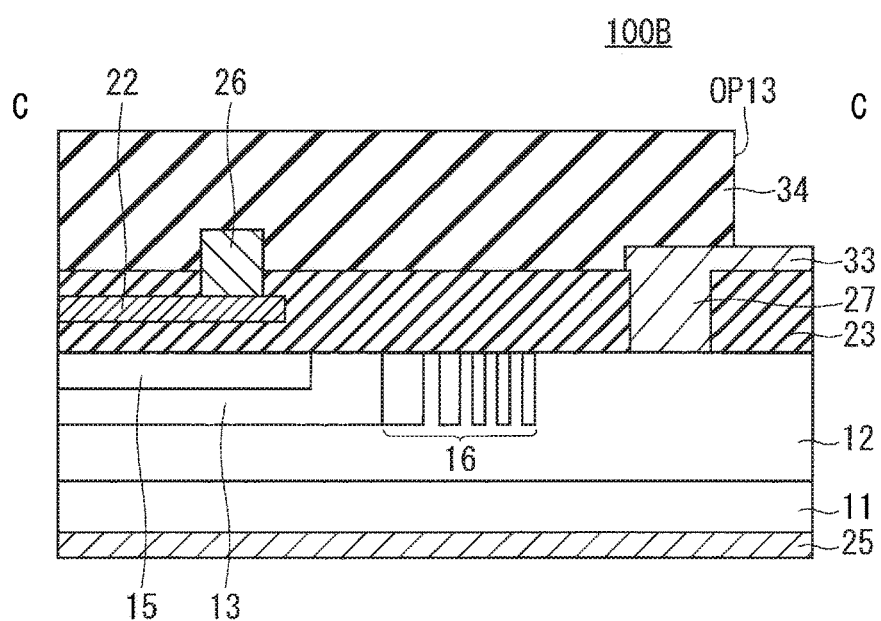

FIG. 11 is a plan view illustrating an upper surface configuration of a semiconductor device 100B according to variation 2 of the first preferred embodiment. FIG. 12 illustrates a cross-sectional configuration of a termination region illustrated by the line B-B in FIG. 11, and FIG. 13 illustrates a cross-sectional configuration of a termination region illustrated by the line C-C in FIG. 11. Note that in FIGS. 11 to 13, the same configuration as in the semiconductor device 100 described with reference to FIGS. 1 and 2 is denoted with the same reference symbol, and the duplicate descriptions thereof will be omitted.

As illustrated in FIGS. 11 to 13, the semiconductor device 100B is covered with an insulation film 34 except for a central portion of a source electrode 24, a central portion of a gate pad 31, and an upper portion of an external corner of an electrode pad 26.

The insulation film 34 is placed in order to inhibit creeping discharge from an outer perimeter portion when measuring withstand voltage characteristics in a test process. The insulation film 34 is made of, for example, resin such as polyimide.

Although a defect detection device 102 is mostly covered with the insulation film 34, an opening OP13 that passes through the insulation film 34 and reaches the electrode pad 26 is provided in at least part of an upper portion of the electrode pad 26. This allows a detection terminal or the like to be connected to the electrode pad 26 from outside, and enables evaluation test of withstand voltage characteristics in the test process.

An opening OP11 that passes through the insulation film 34 and reaches the source electrode 24 is provided on the source electrode 24. An opening OP12 that passes through the insulation film 34 and reaches the gate pad 31 is provided on the gate pad 31. These openings allow the source electrode 24 and the gate pad 31 to be electrically connected to external devices, and allow the semiconductor device 100B to be used as a SiC-MOSFET.

Note that although the semiconductor device 100B illustrated in FIG. 11 has the upper surface configuration of the semiconductor device 100 illustrated in FIG. 1, the semiconductor device 100B may have the upper surface configuration of the semiconductor device 100A illustrated in FIG. 10. Making four corners of the source electrode 24 curvature portions allows electric field concentration to be inhibited and improvement in the withstand voltage to be achieved.

<Variation 3>

Figure 14:
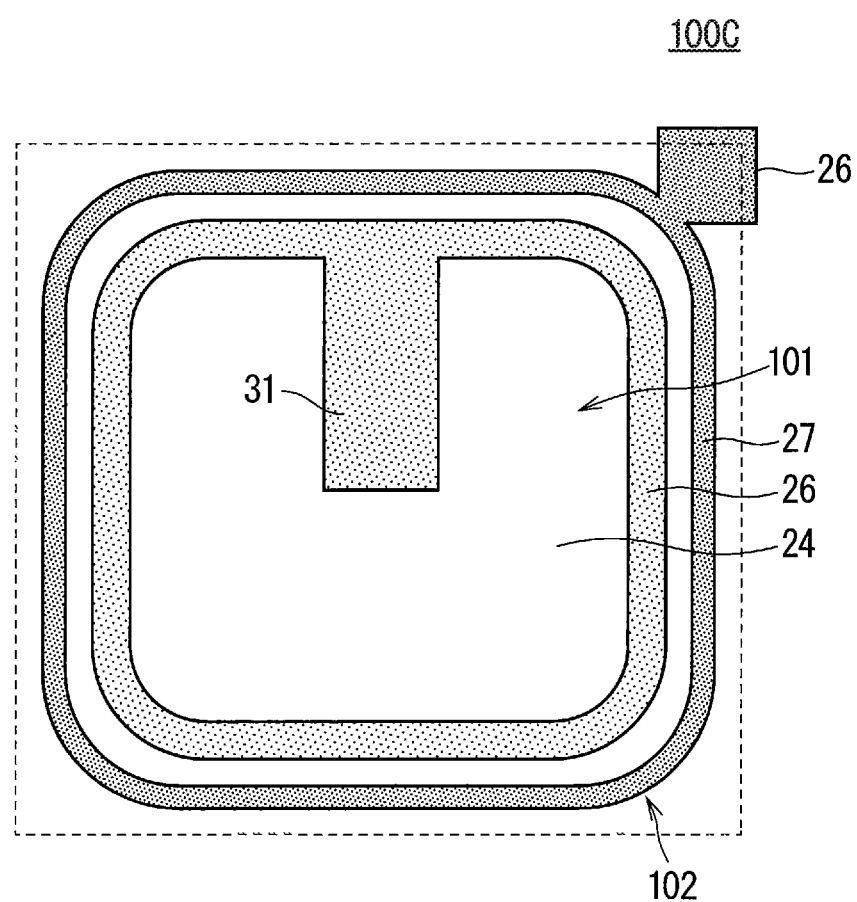
FIG. 14 is a plan view illustrating an upper surface configuration of variation 3 of the semiconductor device of the first preferred embodiment according to the present invention.

FIG. 14 is a plan view illustrating an upper surface configuration of a semiconductor device 100C according to variation 3 of the first preferred embodiment. Note that in FIG. 14, the same configuration as in the semiconductor device 100 described with reference to FIG. 1 is denoted with the same reference symbol, and the duplicate descriptions thereof will be omitted.

As illustrated in FIG. 14, the semiconductor device 100C is identical to the semiconductor device 100A illustrated in FIG. 10 in that four corners of a source electrode 24 have curvatures in order to inhibit electric field concentration. However, instead of placing an electrode pad 26 in space obtained by eliminating the corners of the source electrode 24, an anode electrode 27 also has a shape in which four corners are curvature portions, and the electrode pad 26 is placed so as to extend from an outer edge of one of the four corners to an outer edge of a corresponding corner of the semiconductor device 100C.

Furthermore, the electrode pad 26 is provided so as to go over the corner of the semiconductor device 100C, that is, so as to extend over a dicing line. Although a dashed line illustrates a peripheral portion of the semiconductor device 100C in FIG. 14 for convenience, this dashed line virtually represents the dicing line in a wafer state. In a wafer state, the electrode pad 26 is placed over the dicing line.

Figure 15:
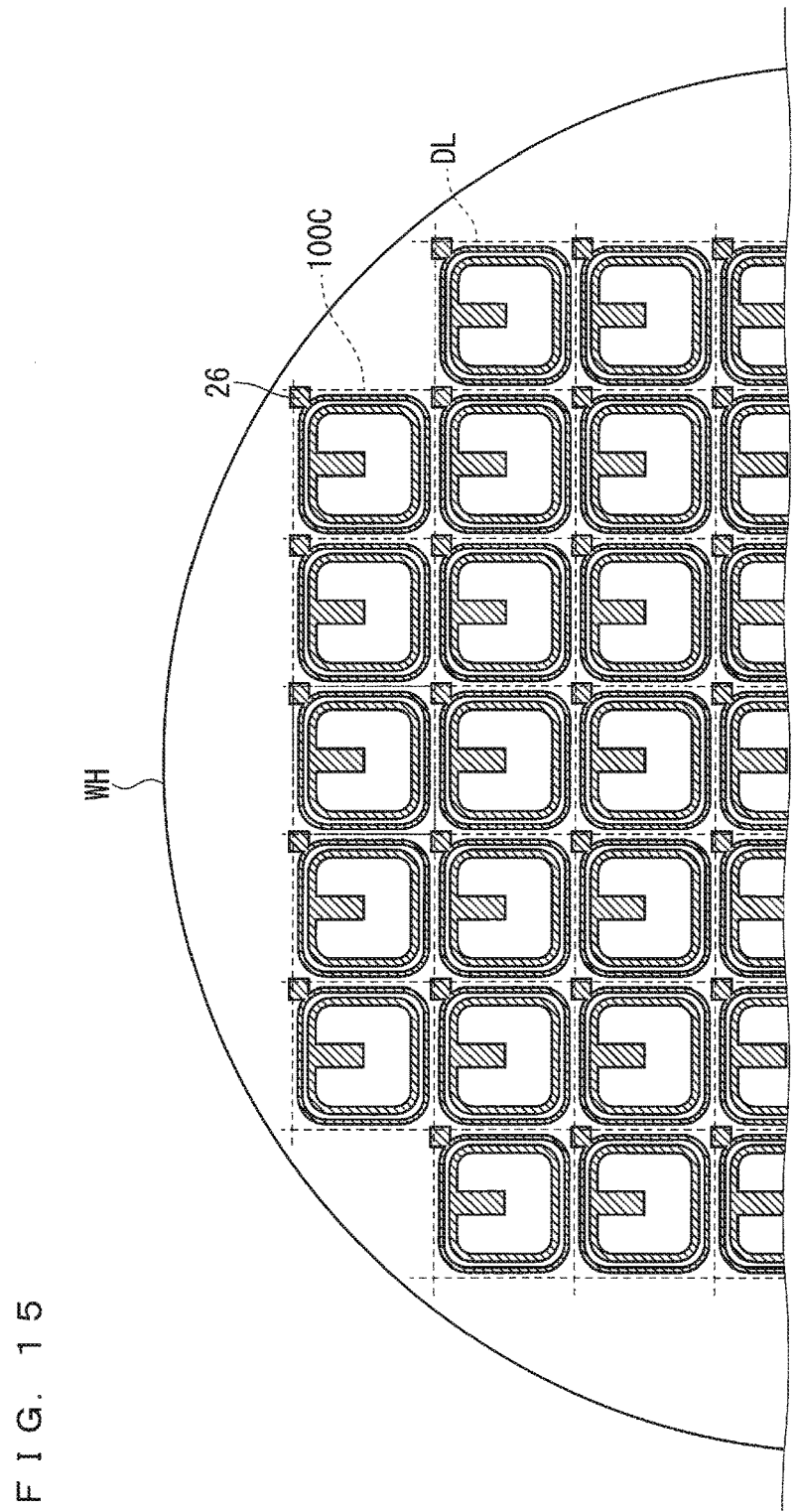
FIG. 15 is a view illustrating a placement example in a wafer state of variation 3 of the semiconductor device of the first preferred embodiment according to the present invention.

Usually, a plurality of semiconductor devices is formed on a semiconductor wafer, and is cut and separated into individual chips in a dicing process, thereby becoming an independent semiconductor device. FIG. 15 is a view illustrating one example of placement of the semiconductor devices 100C in a wafer state, and is a plan view illustrating an upper surface configuration of a wafer WH.

As illustrated in FIG. 15, each semiconductor device 100C has a configuration in which the electrode pad 26 is provided such that part of the electrode pad 26 projects from a corner of the semiconductor device 100C and goes over a dicing line DL, and that the electrode pad 26 is present in a gap of an array of the semiconductor device 100C in a wafer state.

Since a crystal defect in a termination region can be detected using a defect detection device 102 even in a wafer state, the crystal defect can be evaluated by connecting a detection terminal to the electrode pad 26 from outside.

Since the wafer WH is cut into individual chips in the dicing process after a test process is finished, the electrode pad 26 that goes over the dicing line DL will be eliminated. However, in the semiconductor device 100C in a chip state, the electrode pad 26 will remain from an outer edge of one curvature portion of the anode electrode 27 to an outer edge of a corresponding corner of the semiconductor device 100C.

Thus, placing the electrode pad 26 such that part of the electrode pad 26 goes over the dicing line DL can minimize reduction in an effective area of the SiC-MOSFET 101 caused by providing the electrode pad 26.

The semiconductor device 100C is suitable for screening in a wafer state. However, as described above, since the electrode pad 26 remains even after dicing, screening may be performed on the semiconductor device 100C in a chip state after cutting into individual chips in the dicing process.

Note that a placement position of the electrode pad 26 is not limited to one of four corners of the anode electrode 27. As long as the electrode pad 26 is not in contact with the anode electrode 27 of the adjacent semiconductor device 100C in a wafer state, the electrode pad 26 may be provided in a straight line portion of the anode electrode 27.

<Variation 4>

Figure 16:
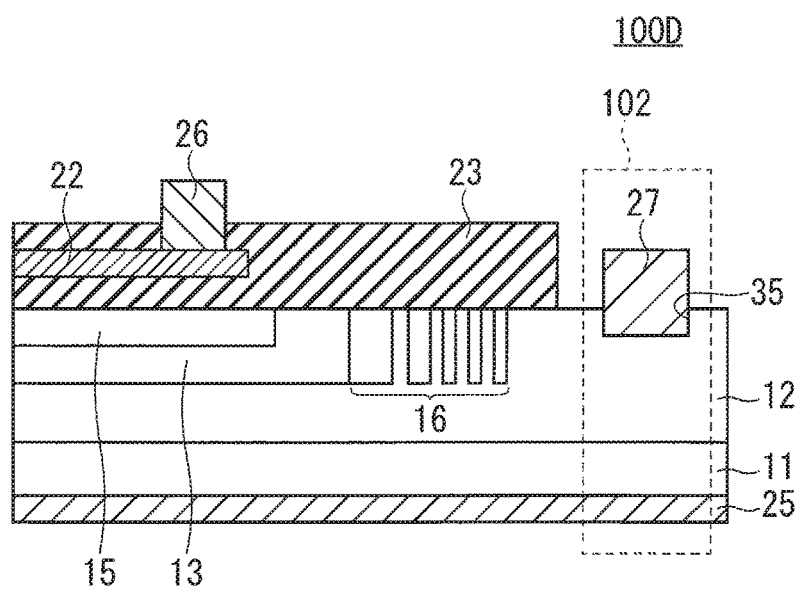
FIG. 16 is a cross-sectional view illustrating a cross-sectional configuration of variation 4 of the semiconductor device of the first preferred embodiment according to the present invention.

FIG. 16 is a cross-sectional view illustrating a configuration in a termination region of a semiconductor device 100D according to variation 4 of the first preferred embodiment. Note that in FIG. 16, the same configuration as in the termination region of the semiconductor device 100 described with reference to FIG. 2 is denoted with the same reference symbol, and the duplicate descriptions thereof will be omitted.

As illustrated in FIG. 16, an anode electrode 27 of a defect detection device 102 is placed such that a bottom surface side is inserted into a recess portion 35 formed in an epitaxial layer 12. The recess portion 35 has a bottom surface at a position retreated into the epitaxial layer 12 from a main surface position of the epitaxial layer 12. Placing the anode electrode 27 at this position causes the bottom surface and side surface of the anode electrode 27 to be in contact with a portion deeper than the main surface position of the epitaxial layer 12.

The bottom surface and the side surface of the anode electrode 27 that are in contact with this recess portion 35 serve as regions for detecting a crystal defect. A region for detecting a crystal defect is wider than in the semiconductor device 100 in which only the bottom surface of the anode electrode 27 is in contact with the epitaxial layer 12.

Also, providing the recess portion 35 causes the bottom surface of the anode electrode 27 to be positioned within the epitaxial layer 12 more than the main surface position of the epitaxial layer 12. This makes the bottom surface of the anode electrode 27 closer to a crystal defect that is present within the epitaxial layer 12. This also produces an effect that the crystal defect can be detected more easily.

Note that although depth of the recess portion 35 may be set arbitrarily, when a deep recess is formed, a wafer is preferably heated when a conductive film is formed by sputtering, in order to improve coverage of the anode electrode 27.

<Second Preferred Embodiment>

The first preferred embodiment and variations thereof have described examples in which a Schottky barrier diode is used as a defect detection device 102. Meanwhile, a PiN diode may be used as the defect detection device 102.

Figure 17:
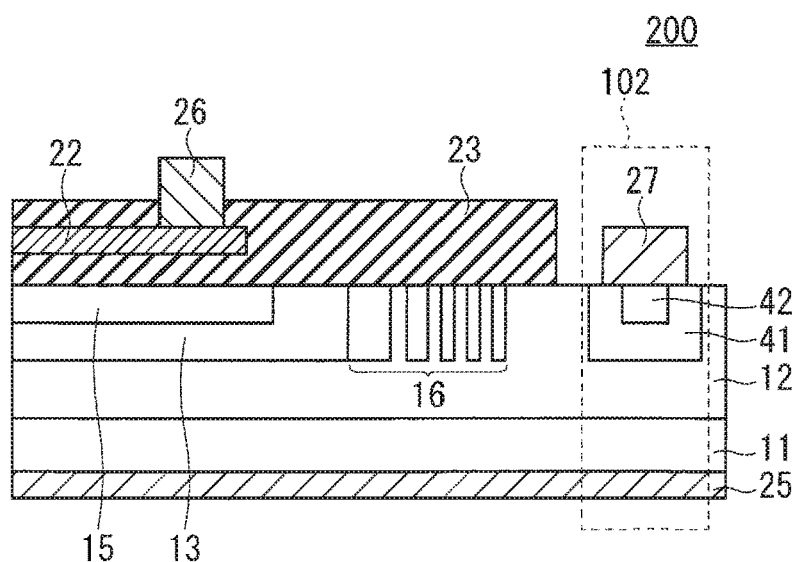
FIGS. 17 to 18 are cross-sectional views each illustrating a cross-sectional configuration of a semiconductor device of a second preferred embodiment according to the present invention.

FIG. 17 is a cross-sectional view illustrating a configuration in a termination region of a semiconductor device 200 of a second preferred embodiment of a semiconductor device according to the present invention. Note that in FIG. 17, the same configuration as in the termination region of the semiconductor device 100 described with reference to FIG. 2 is denoted with the same reference symbol, and the duplicate descriptions thereof will be omitted. A configuration of an active region is identical to the active region of the semiconductor device 100, and thus illustration thereof will be omitted.

As illustrated in FIG. 17, in the semiconductor device 200, a PiN diode constitutes a defect detection device 102. That is, the defect detection device 102 includes an anode electrode 27 provided on an epitaxial layer 12, a p-type anode region 41 selectively provided in an upper layer of the epitaxial layer 12 with which the anode electrode 27 is in contact, and a p-type contact region 42 provided in an upper layer of the anode region 41.

The anode region 41 and the contact region 42 can be formed in the same process as a well region 13 and a well contact region 15 of the active region, respectively. A depth of the anode region 41 is 0.3 μm to 2.0 μm, and an impurity concentration is $1 \times 10^{15}$ cm$^{-3}$ to $1 \times 10^{18}$ cm$^{-3}$. An impurity concentration of the contact region 42 is $1 \times 10^{17}$ cm$^{-3}$ to $1 \times 10^{21}$ cm$^{-3}$, and a depth is 0.3 μm to 1.0 μm.

Note that the anode region 41 and the contact region 42 may be formed in a different process from the well region 13 and the well contact region 15 of the active region, respectively. In this case, each depth and impurity concentration can be set independently.

Here, when an n-type impurity concentration of the epitaxial layer 12 is about $1 \times 10^{13}$ cm$^{-3}$ to $1 \times 10^{15}$ cm$^{-3}$, the epitaxial layer 12 can be called an i (Intrinsic) layer. The anode region 41, the epitaxial layer 12, and an SiC substrate 11 constitute a PiN diode.

Since a PiN diode constitutes the defect detection device 102, characteristic fluctuation can be detected after applying bipolar stress to the defect detection device 102.

Note that when the n-type impurity concentration of the epitaxial layer 12 is about $1 \times 10^{18}$ cm$^{-3}$, the epitaxial layer 12 is not an i (Intrinsic) layer, and the defect detection device 102 may be a PN diode.

<Third Preferred Embodiment>

The second preferred embodiment has described an example in which a PiN diode is used as a defect detection device 102. However, a diode having a PiN diode region and a Schottky barrier diode region may be used as the defect detection device 102.

Figure 18:
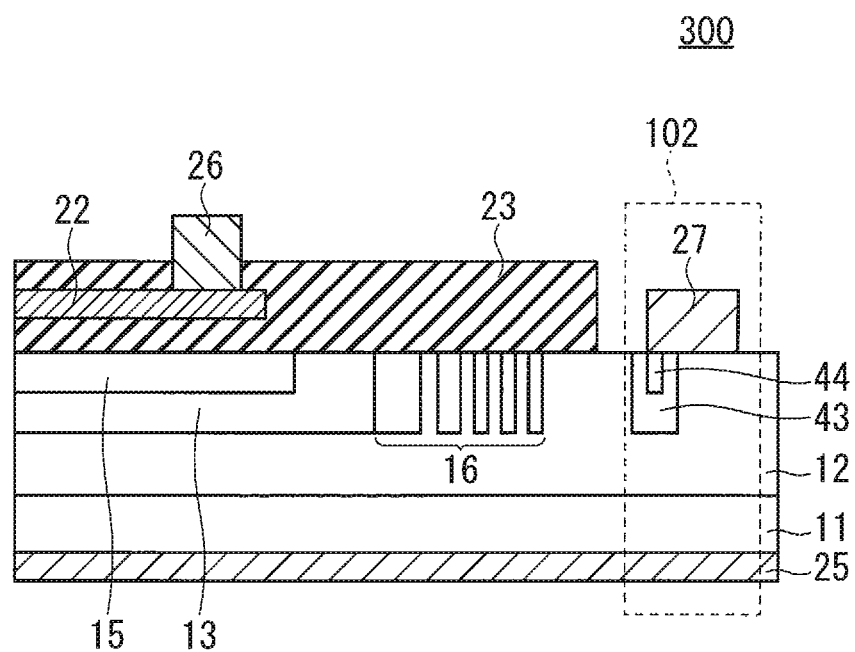

FIG. 18 is a cross-sectional view illustrating a configuration in a termination region of a semiconductor device 300 of a third preferred embodiment of a semiconductor device according to the present invention. Note that in FIG. 18, the same configuration as in the termination region of the semiconductor device 100 described with reference to FIG. 2 is denoted with the same reference symbol, and the duplicate descriptions thereof will be omitted. A configuration of an active region is identical to the active region of the semiconductor device 100, and thus illustration thereof will be omitted.

As illustrated in FIG. 18, in the semiconductor device 300, a defect detection device 102 includes a PiN diode region and a Schottky barrier diode region. That is, the defect detection device 102 includes a region in which an anode electrode 27 provided on an epitaxial layer 12 is in contact with a p-type anode region 43 selectively provided in an upper layer of the epitaxial layer 12 and a p-type contact region 44 provided in an upper layer of the anode region 43, and a region in which the anode electrode 27 is in contact with the epitaxial layer 12.

Here, when an n-type impurity concentration of the epitaxial layer 12 is about $1\times10^{13}$ cm$^{-3}$ to $1\times10^{15}$ cm$^{-3}$, the epitaxial layer 12 can be called an i (Intrinsic) layer. The anode region 43, the epitaxial layer 12, and an SiC substrate 11 constitute a PiN diode region.

Since the anode electrode 27 makes a Schottky contact with the epitaxial layer 12, the anode electrode 27 and the epitaxial layer 12 constitute a Schottky barrier diode region.

Thus, since the defect detection device 102 includes the PiN diode region and the Schottky barrier diode region, after bipolar stress is applied to the defect detection device 102, the defect detection device 102 can detect characteristic fluctuation in a unipolar operation region.

Note that when the n-type impurity concentration of the epitaxial layer 12 is about $1\times10^{18}$ cm$^{-3}$, the epitaxial layer 12 is not an i (Intrinsic) layer, and the PiN diode region may be a PN diode region.

<Fourth Preferred Embodiment>

A screening method performed by a defect detection device 102 described in the first preferred embodiment has been described to detect, by using at least one of a forward characteristic and a reverse characteristic of a diode detected by the defect detection device 102, a crystal defect in a termination region that cannot be detected by a current stress test on a body diode in an active region of a SiC-MOSFET 101. However, the screening method by the defect detection device 102 may be combined with the known screening method disclosed in WO 2014/148294.

For example, bipolar current stress is applied by continuously passing a forward current of current density of 120 to 400 A/cm$^2$ through a body diode of the SiC-MOSFET 101 in the active region. Based on a fluctuation value of at least one of the forward characteristic and the reverse characteristic of a diode detected by the defect detection device 102 before and after application of the bipolar current stress, determination and selection of reliability of a semiconductor device are made.

For example, before the bipolar current stress is applied to the body diode of the SiC-MOSFET 101, the forward characteristic of the diode as illustrated as the characteristic C1 of FIG. 3 is obtained. Meanwhile, after the bipolar current stress is applied, when the characteristic as illustrated as the characteristic C2 of FIG. 3 is obtained, it can be determined that there is an influence on the crystal defect in the termination region resulting from expansion of the crystal defect of the body diode. Also, since an anode current corresponding to the same anode voltage will decrease when the current is hampered resulting from expansion of the crystal defect, increase in an anode-cathode resistance value may be observed, and it can be determined with the resistance value in this case.

Using such a method enables screening in consideration of influence on the crystal defect in the termination region by expanding the crystal defect of the body diode to saturation.

Also, as in the semiconductor device 200 of the second preferred embodiment, when a PiN diode (or PN diode) constitutes the defect detection device 102, and as in the semiconductor device 300 of the third preferred embodiment, when the defect detection device 102 includes a PiN diode region (or PN diode region) and a Schottky barrier diode region, the bipolar current stress may be applied to the defect detection device 102 itself. Based on a fluctuation value of at least one of the forward characteristic and the reverse characteristic of a diode detected by the defect detection device 102 before and after application of the bipolar current stress, determination and selection of reliability of a semiconductor device are made.

For example, before the bipolar current stress is applied to the defect detection device 102, the forward characteristic of the diode as illustrated as the characteristic C1 of FIG. 3 is obtained. Meanwhile, after the bipolar current stress is applied, when the characteristic as illustrated as the characteristic C2 of FIG. 3 is obtained, it can be determined that the crystal defect in the termination region has expanded. Also, since anode current corresponding to the same anode voltage will decrease when the current is hampered resulting from expansion of the crystal defect, increase in the anode-cathode resistance value may be observed, and it can be determined with the resistance value in this case.

Using such a method enables evaluation of characteristic fluctuation caused by expansion of the crystal defect in the termination region and further improvement in determination accuracy of reliability of the semiconductor device.

<Other Application Examples>

The first to fourth preferred embodiments described above have described configurations in which the present invention is applied to an SiC semiconductor device. However, application of the present invention is not limited to this application, and the present invention may be applied to a wide-bandgap semiconductor device that includes another wide-bandgap semiconductor, such as gallium nitride (GaN).

Also, the present invention is applicable to a freestanding substrate (independent substrate) including only the epitaxial layer 12, with the SiC substrate 11 eliminated by some method such as a mechanical or chemical method.

Note that in the present invention, preferred embodiments may be arbitrarily combined, or various modifications and omissions may be made to the preferred embodiments as appropriate without departing from the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
    an active region provided in a first conductivity type semiconductor layer, a MOS transistor through which a main current flows in a thickness direction of said semiconductor layer being formed in the active region; and
    a termination region provided around said active region, wherein
    said termination region includes a defect detection device provided along said active region configured to detect the presence of a crystal defect in said termination region,
    said defect detection device includes a diode including:

a first main electrode provided along said active region on a first main surface of said semiconductor layer; and a second main electrode provided on a second main surface side of said semiconductor layer.

2. The semiconductor device according to claim 1, wherein said diode is a Schottky barrier diode in which said first main electrode makes a Schottky contact with said semiconductor layer.

3. The semiconductor device according to claim 1, wherein said diode is one of a PN diode and a PiN diode including a second conductivity type impurity region selectively provided in an upper layer of said semiconductor layer so as to be in contact with said first main electrode.

4. The semiconductor device according to claim 1, wherein said diode includes:
   one of a PN diode region and a PiN diode region including a second conductivity type impurity region selectively provided in an upper layer of said semiconductor layer so as to be in contact with said first main electrode; and
   a Schottky barrier diode region in which said first main electrode makes a Schottky contact with said semiconductor layer.

5. The semiconductor device according to claim 1, wherein
   said diode includes an electrode pad connected to part of said first main electrode, and
   said electrode pad is electrically isolated from said active region.

6. The semiconductor device according to claim 5, wherein
   said active region is quadrangular with a corner being a curvature portion in plan view,
   said first main electrode includes a curvature portion in a portion corresponding to the curvature portion of said active region, and
   said electrode pad is placed between the curvature portion of said active region and the curvature portion of said first main electrode.

7. The semiconductor device according to claim 5, further comprising an insulation film provided so as to cover at least said termination region, wherein said insulation film is provided in at least part of an upper portion of said electrode pad, and includes an opening that reaches said electrode pad.

8. The semiconductor device according to claim 5, wherein said electrode pad is placed from an outer edge of said first main electrode to an outer edge of said semiconductor layer.

9. The semiconductor device according to claim 1, wherein in said diode, a bottom surface side of said first main electrode is inserted into a recess portion provided in said first main surface of said semiconductor layer.

10. The semiconductor device according to claim 1, wherein said semiconductor layer is a silicon carbide semiconductor layer.

* * * * *

UNITED STATES PATENT AND TRADEMARK OFFICE
CERTIFICATE OF CORRECTION

PATENT NO. : 10,276,711 B2
APPLICATION NO. : 15/841724
DATED : April 30, 2019
INVENTOR(S) : Yuji Ebiike and Naoki Yutani Page 1 of 1

It is certified that error appears in the above-identified patent and that said Letters Patent is hereby corrected as shown below:

In the Specification

In Column 10, Lines 4-6:
"Note that the thickness of the field insulation film FX corresponds to the thickness of the silicon oxide film OX is eliminated in the termination region."

Should read:
--Note that the thickness of the field insulation film FX corresponding to the thickness of the silicon oxide film OX is eliminated in the termination region.--

Signed and Sealed this
Eighteenth Day of June, 2019

Andrei Iancu
*Director of the United States Patent and Trademark Office*